US007276421B2

(12) United States Patent
Kim et al.

(10) Patent No.: US 7,276,421 B2
(45) **Date of Patent: *Oct. 2, 2007**

(54) METHOD OF FORMING SINGLE CRYSTAL SEMICONDUCTOR THIN FILM ON INSULATOR AND SEMICONDUCTOR DEVICE FABRICATED THEREBY

(75) Inventors: Jong-Hyuk Kim, Incheon-si (KR); Soon-Moon Jung, Yongin-si (KR); Won-Seok Cho, Suwon-si (KR); Jae-Hoon Jang, Hwaseong-si (KR); Kun-Ho Kwak, Yongin-si (KR); Sung-Jin Kim, Hwaseong-si (KR); Jae-Joo Shim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/197,836

(22) Filed: Aug. 5, 2005

(65) Prior Publication Data

US 2006/0097319 A1 May 11, 2006

(30) Foreign Application Priority Data

Nov. 5, 2004 (KR) ...................... 10-2004-0090061

(51) Int. Cl.
*H01L 21/331* (2006.01)

(52) U.S. Cl. ....................... 438/373; 438/506; 438/514

(58) Field of Classification Search ................ 257/777, 257/778, 724, 725
See application file for complete search history.

(56) References Cited

U.S. PATENT DOCUMENTS 5,834,354 A 11/1998 Kadosh et al. .............. 438/305
6,022,766 A 2/2000 Chen et al. ................. 438/152
6,172,381 B1 1/2001 Gardner et al. ............... 257/67
6,429,484 B1 8/2002 Yu ............................ 257/347
2005/0133789 A1* 6/2005 Oh et al. ...................... 257/66

FOREIGN PATENT DOCUMENTS

KR 1020030044796 6/2003
KR 1020030044858 6/2003

* cited by examiner

*Primary Examiner*—Thao P. Le
(74) *Attorney, Agent, or Firm*—Mills & Onello LLP

(57) ABSTRACT

Methods of forming a single crystal semiconductor thin film on an insulator and semiconductor devices fabricated thereby are provided. The methods include forming an interlayer insulating layer on a single crystal semiconductor layer. A single crystal semiconductor plug is formed to penetrate the interlayer insulating layer. A semiconductor oxide layer is formed within the single crystal semiconductor plug using an ion implantation technique and an annealing technique. As a result, the single crystal semiconductor plug is divided into a lower plug and an upper single crystal semiconductor plug with the semiconductor oxide layer being interposed therebetween. That is, the upper single crystal semiconductor plug is electrically insulated from the lower plug by the semiconductor oxide layer. A single crystal semiconductor pattern is formed to be in contact with the upper single crystal semiconductor plug and cover the interlayer insulating layer. The single crystal semiconductor pattern is grown by an epitaxy growth technique using the upper single crystal semiconductor plug as a seed layer, or by a solid epitaxy growth technique using the upper single crystal semiconductor plug as a seed layer.

7 Claims, 7 Drawing Sheets

31
17
15
1
13d"
5
7t"
27a
43n"
45n"
13n"
3b
H2
29d
25
27b
23b
121U
125
121B
13s"
TL2
29s
17
19
7d"
9
11

METHOD OF FORMING SINGLE CRYSTAL SEMICONDUCTOR THIN FILM ON INSULATOR AND SEMICONDUCTOR DEVICE FABRICATED THEREBY

CROSS-REFERENCE TO RELATED APPLICATION

This application claims the benefit of Korean Patent Application No. 2004-0090061, filed Nov. 5, 2004, the contents of which are hereby incorporated herein by reference in their entirety.

BACKGROUND OF THE INVENTION

1. Field of the Invention

The present invention relates to semiconductor devices and methods of fabricating the same, and more particularly, to methods of forming a single crystal semiconductor thin film on an insulator and semiconductor devices fabricated thereby.

2. Description of the Related Art

As electronic products employing semiconductor devices become lightweight and small in size, a high integration density per unit area, a low threshold voltage Vth, a fast operating speed and low power consumption are required for the semiconductor devices. Discrete devices such as metal oxide semiconductor (MOS) transistors are widely employed as switching devices for the semiconductor devices. In response to requirements for the high integration density as described above, methods of stacking a plurality of transistors on a limited area of a semiconductor substrate have been researched. The method of stacking the transistors includes forming a lower transistor on the semiconductor substrate, forming an insulating layer for covering the lower transistor, and forming a thin film transistor on the insulating layer. However, the method of stacking the transistors is accompanied by several difficulties.

Semiconductor devices having TFTs stacked on a semiconductor substrate are disclosed in U.S. Pat. No. 6,022,766, entitled "Semiconductor Structure Incorporating Thin Film Transistors and Methods for Its Manufacture" to Chen et al.

FIG. 1 is a cross-sectional view illustrating a structure of the stacked transistors in accordance with U.S. Pat. No. 6,022,766.

Referring to FIG. 1, a typical bulk transistor is formed on a single crystal silicon substrate, and a thin film transistor is stacked on the bulk transistor. An interlayer insulating layer and a cap oxide layer 189 are sequentially interposed between the bulk transistor and the thin film transistor. The thin film transistor includes a body layer formed on the cap oxide layer 189. The body layer is divided into source and drain regions 190A and 190B and a channel region 196. A gate electrode 194A is formed over the channel region 196. A gate insulating layer 192 is interposed between the gate electrode 194A and the body layer. An upper insulating layer is formed to cover the entire surface of the semiconductor substrate including the gate electrode 194A.

Studs 182 and 184 are formed on the source and drain regions of the bulk transistor. One of the source and drain regions of the bulk transistor is electrically connected to one of the source and drain regions 190A and 190B of the thin film transistor via the stud 182 and an interfacial cap 188A formed on the stud 182.

The body layer of the thin film transistor is formed by forming an amorphous silicon layer on the entire surface of the semiconductor substrate having the studs 182 and 184 and the interfacial cap 188A and crystallizing the amorphous silicon layer using an annealing process. In this case, the body layer corresponds to a polysilicon layer having great grains. That is, it is difficult to transform the body into a completely single crystal silicon layer. Consequently, it is difficult to form the thin film transistor having the electrical characteristics corresponding to that of the bulk MOS transistor.

Other semiconductor devices having stacked transistors on a semiconductor substrate are disclosed in U.S. Pat. No. 6,429,484 B1 entitled "Multiple Active Layer Structure and A Method of Making Such a Structure" to Yu.

According to Yu, an interlayer insulating layer is formed on a semiconductor substrate, and a window penetrating the interlayer insulating layer is formed to expose the semiconductor substrate. An amorphous semiconductor layer is formed to completely fill the window and cover the interlayer insulating layer. The amorphous semiconductor layer is crystallized using a solid phase epitaxial (SPE) technique. As a result, a single crystal semiconductor plug is formed within the window, and a single crystal semiconductor body is formed on the interlayer insulating layer.

However, when impurity ions are implanted into the single crystal semiconductor plug, it may have conductivity. Accordingly, there is a limitation in determining a position for forming the window when an insulating characteristic is required between the single crystal semiconductor body and the semiconductor substrate.

SUMMARY OF THE INVENTION

The invention provides methods of forming a single crystal semiconductor thin film on an insulator and semiconductor devices having a single crystal semiconductor thin film. The invention also provides thin film transistor SRAM cells suitable for enhancing reliability and integration density.

In one aspect, the invention is directed to methods of forming a single crystal semiconductor thin film on an insulator. These methods include forming an interlayer insulating layer on a single crystal semiconductor layer. A single crystal semiconductor plug is formed to penetrate the interlayer insulating layer. A semiconductor-oxide layer is formed within the single crystal semiconductor plug using an ion implantation technique and an annealing technique. As a result, the single crystal semiconductor plug is divided into a lower plug and an upper single crystal semiconductor plug with the semiconductor oxide layer being interposed therebetween. That is, the upper single crystal semiconductor plug is electrically insulated from the lower plug by the semiconductor oxide layer. A single crystal semiconductor pattern is formed to be in contact with the upper single crystal semiconductor plug and cover the interlayer insulating layer.

In one embodiment, a gate dielectric layer and a gate electrode may be sequentially stacked on the single crystal semiconductor layer prior to the formation of the interlayer insulating layer. Insulating spacers may be formed on sidewalls of the gate electrode. An etch stop layer may be formed on the single crystal semiconductor layer having the gate electrode. The etch stop layer may be formed of a material having an etch selectivity with respect to the interlayer insulating layer.

In still another embodiment, the single crystal semiconductor plug may be formed by a selective epitaxial growth technique using the single crystal semiconductor layer as a seed layer. In this case, the single crystal semiconductor plug may be formed to have the same crystalline state as that of the single crystal semiconductor layer.

In still another embodiment, the ion implantation may be performed by an ion implantation process containing oxygen (O). The ion implantation process may adjust depth and concentration of the oxygen ions implanted using various energy levels and angles. In addition, the annealing process induces an oxidation reaction between a constituting material of the single crystal semiconductor plug and the oxygen ions (O) implanted into the single crystal semiconductor plug. Accordingly, the semiconductor oxide layer may be formed at a desired depth of the single crystal semiconductor plug.

In still another embodiment, forming the single crystal semiconductor pattern may include forming a non-single crystalline semiconductor layer on the interlayer insulating layer having the upper single crystalline semiconductor plug, and crystallizing the non-single crystalline semiconductor layer using a solid phase epitaxial technique employing the upper single crystalline semiconductor plug as a seed layer. The non-single crystalline semiconductor layer may be formed of an amorphous semiconductor layer or a polycrystalline semiconductor layer. In this case, the single crystalline semiconductor pattern may be formed to have the same crystalline state as that of the upper single crystalline semiconductor plug.

In still another embodiment, the single crystalline semiconductor pattern may be formed by a selective epitaxial growth technique using the upper single crystalline semiconductor as a seed layer. Similarly, the single crystalline semiconductor pattern may also be formed to have the same crystalline state as that of the upper single crystalline semiconductor plug.

In another aspect, the invention is directed to a semiconductor device fabricated by the method of forming the single crystalline semiconductor thin film. The device includes an interlayer insulating layer deposited on a single crystalline semiconductor layer. A lower plug, a semiconductor oxide layer, and an upper single crystalline semiconductor plug, which penetrate the interlayer insulating layer to be in contact with the single crystalline semiconductor layer, are sequentially stacked. A single crystalline semiconductor pattern is formed on the interlayer insulating layer. The single crystalline semiconductor pattern is grown by an epitaxy growth technique using the upper single crystalline semiconductor plug as a seed layer or by a solid phase epitaxial technique using the upper single crystalline semiconductor plug as a seed layer.

In one embodiment, the single crystalline semiconductor layer may be a silicon wafer, a germanium wafer, or a compound semiconductor wafer. In addition, the single crystalline semiconductor layer may be a single crystalline semiconductor layer, a germanium layer, or a compound semiconductor layer formed on the substrate.

In another embodiment, the upper single crystalline semiconductor plug may have the same crystalline state as that of the single crystalline semiconductor layer. The upper single crystalline semiconductor plug may be a single crystalline silicon layer.

In another aspect, the invention is directed to thin film transistor (TFT) SRAM cells. The TFT SRAM cells are comprised of first and second half cells. Each of the first and second half cells has an isolation layer which is formed in a predetermined region of a single crystalline semiconductor substrate to define an active region. A driver transistor is formed in the active region. The driver transistor has not only source and drain regions formed within the active region but also a drive gate electrode crossing over a channel region between the source and drain regions. A first interlayer insulating layer is formed on the substrate having the driver transistor. A lower plug, a semiconductor oxide layer, and an upper single crystalline semiconductor plug, which penetrate the first interlayer insulating layer to be in contact with the source region of the driver transistor, are sequentially stacked. A single crystalline semiconductor body is formed on the first interlayer insulating layer and is in contact with the upper single crystalline semiconductor plug. The single crystalline semiconductor body has a single crystalline semiconductor pattern which is grown by an epitaxy growth technique using the upper single crystalline semiconductor plug as a seed layer or crystallized by a solid phase epitaxial technique using the upper single crystalline semiconductor plug as a seed layer.

In one embodiment, the upper single crystalline semiconductor plug may have the same crystalline state as that of the single crystalline semiconductor substrate. The upper single crystalline semiconductor plug may be a single crystalline silicon layer. The upper single crystalline semiconductor plug is electrically insulated from the lower plug by the semiconductor oxide layer.

In another embodiment, a load thin film transistor may be formed in the single crystalline semiconductor body. The load thin film transistor may have a load gate electrode crossing over the single crystalline semiconductor body and covering both sidewalls of the single crystalline semiconductor body, a source region adjacent to the load gate electrode and formed on the upper single crystalline semiconductor plug, and a drain region adjacent to the load gate electrode and formed on the opposite side of the source region.

In still another embodiment, a transfer transistor adjacent to the driver transistor may be formed in the active region. The transfer transistor may have not only a transfer gate electrode crossing over the active region but also source and drain regions positioned at both sides of the channel region below the transfer gate electrode, respectively. The source region of the transfer transistor may correspond to the drain region of the driver transistor.

In still another embodiment, an etch stop layer may be formed between the drain region of the driver transistor and the first interlayer insulating layer. The etch stop layer may be an insulating layer having an etch selectivity with respect to the first interlayer insulating layer.

In still another embodiment, a second interlayer insulating layer may be formed on the substrate having the load thin film transistor and the transfer transistor. A node metal plug penetrating the first and second interlayer insulating layers may be formed. The node metal plug may be a metal layer having an ohmic contact to the drain region of the load thin film transistor and the drain region of the driver transistor.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

FIGS. 2 to 5 are cross-sectional views illustrating methods of forming a single crystal semiconductor thin film in accordance with embodiments of the present invention.

Figure 1:
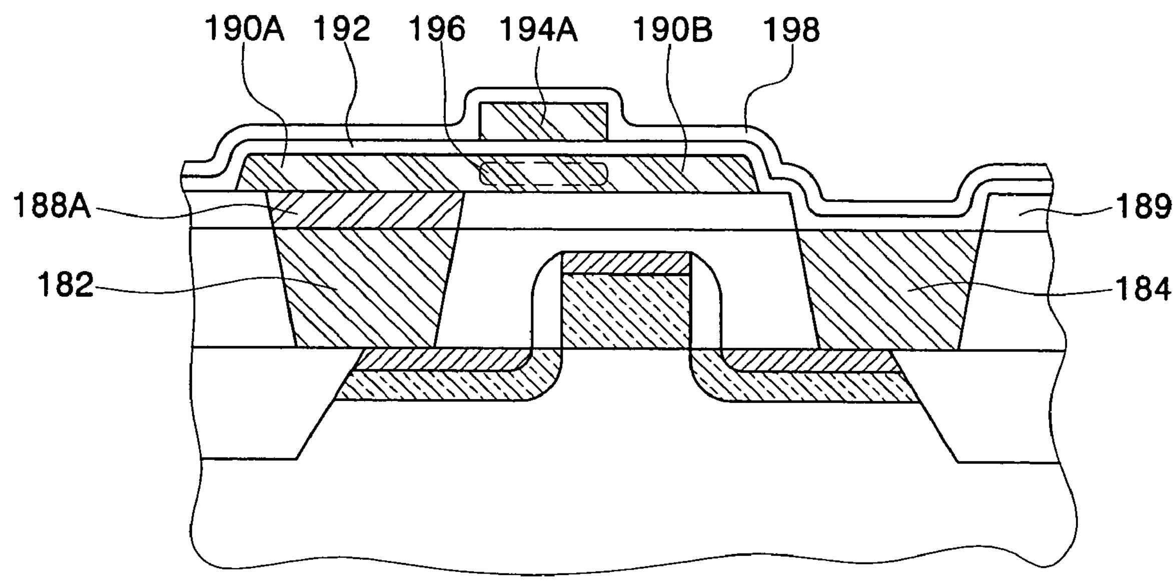
FIG. 1 is a cross-sectional view illustrating a conventional semiconductor device.
Figure 2:
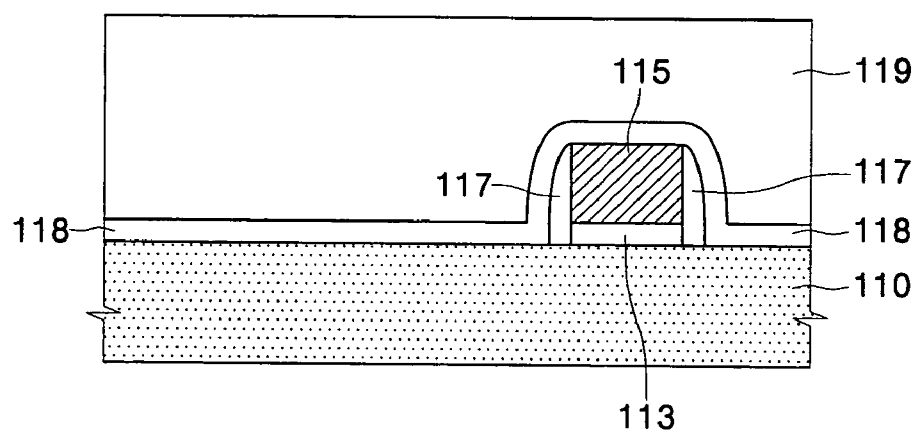
FIGS. 2 to 5 are cross-sectional views illustrating methods of forming a single crystal semiconductor thin film in accordance with embodiments of the present invention.

Referring to FIG. 2, the methods of forming a single crystalline semiconductor thin film according to embodiments of the present invention include forming an interlayer insulating layer 119 on a single crystalline semiconductor layer 110. A substrate having the single crystalline semiconductor layer 110 is prepared. The single crystalline semiconductor layer 110 may be a semiconductor substrate such as a silicon wafer, a germanium wafer, or a compound semiconductor wafer. In addition, the single crystalline semiconductor layer 110 may be a single crystalline silicon layer, a germanium layer, or a compound semiconductor layer formed on the substrate. Typically, an isolation layer (not shown) defining an active region is formed within the single crystalline semiconductor layer 110, however, it is omitted for simplicity of description. A gate dielectric layer 113 and a gate electrode 115 may be sequentially stacked on the single crystalline semiconductor layer 110. Insulating spacers 117 may be formed on sidewalls of the gate electrode 115. An etch stop layer 118 is preferably formed on the single crystalline semiconductor layer 110 having the gate electrode 115. The interlayer insulating layer 119 is formed on the single crystalline semiconductor layer having the etch stop layer 118.

The interlayer insulating layer 119 may be formed of an insulating layer such as a high density plasma (HDP) oxide layer. The etch stop layer 118 is preferably formed of a material layer having an etch selectivity with respect to the interlayer insulating layer 119. For example, the etch stop layer 118 may be a nitride layer such as a silicon nitride layer formed by a chemical vapor deposition (CVD) method.

Figure 3:
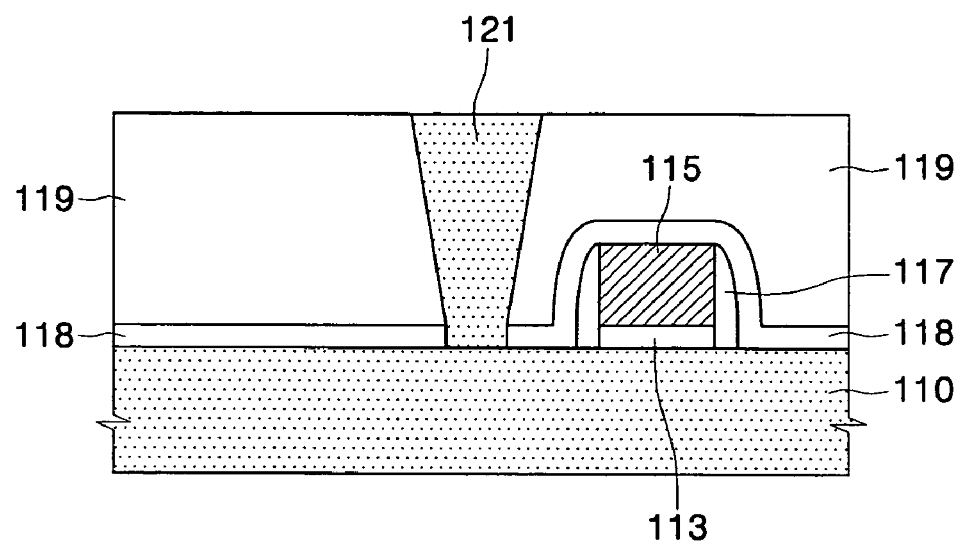

Referring to FIG. 3, the interlayer insulating layer 119 and the etch stop layer 118 are sequentially patterned to form a contact hole exposing the single crystalline semiconductor layer 110. The patterning process may include forming a photoresist pattern on the interlayer insulating layer 119 and etching the interlayer insulating layer 119 and the etch stop layer 118 using the photoresist pattern as an etch stop layer. When viewed from its cross-sectional view, the contact hole may have an inverse trapezoid shape of which a top width is larger than its bottom width, or a trapezoid shape of which the top width is smaller than the bottom width, however, it is assumed that the contact hole has the inverse trapezoid shape. A single crystalline semiconductor plug 121 is formed on the single crystalline semiconductor layer 110 with the contact hole using a selective epitaxial growth (SEG) technique.

In this case, the single crystalline semiconductor plug 121 is grown to have the same crystalline state as that of the single crystalline semiconductor layer 110. For example, when the single crystalline semiconductor layer 110 is a single crystalline silicon layer and the SEG technique is performed using a silicon source gas, the single crystalline semiconductor plug 121 is formed to be a single crystalline silicon layer. When the single crystalline semiconductor plug 121 is overgrown to be higher than the top surface of the interlayer insulating layer 119, the single crystalline semiconductor plug 121 may planarized by a chemical mechanical polishing (CMP) process so that it may have the same height as that of the interlayer insulating layer 119.

Figure 4:
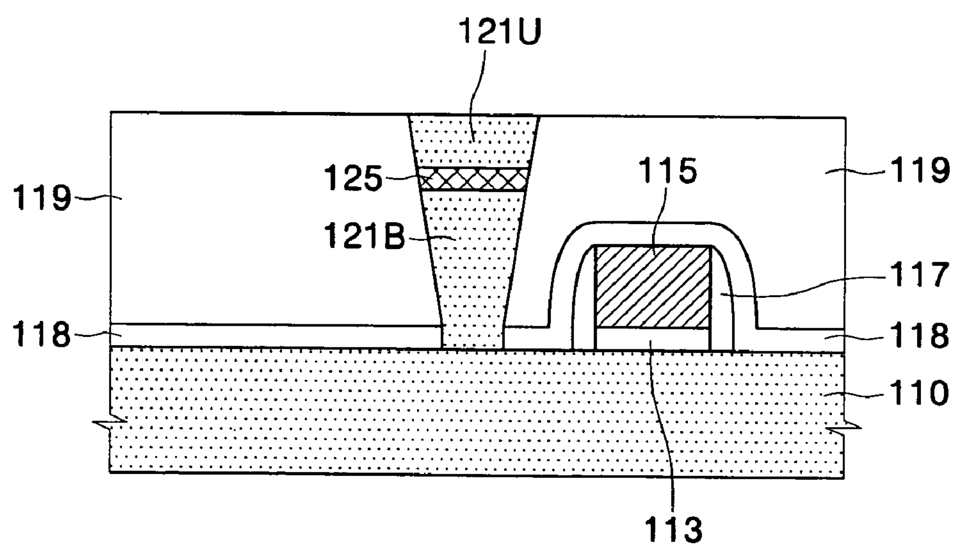

Referring to FIG. 4, an ion implantation process containing oxygen (O) and an annealing process are performed on the single crystalline semiconductor layer 110 having the single crystalline semiconductor plug 121 using the interlayer insulating layer 119 as an ion implantation mask. The ion implantation process may adjust depth and concentration of the oxygen (O) ions implanted using various energy levels and angles. That is, the oxygen (O) ions may be implanted into the single crystalline semiconductor plug 121 at desired depth and concentration based on the conditions of the ion implantation process. The annealing process induces an oxidation reaction between a constituting material of the single crystalline semiconductor plug 12 and the oxygen (O) ions implanted into the single crystalline semiconductor plug 121. In addition, the annealing process may act to cure the surface damage of the single crystalline semiconductor plug 121 which may occur during the ion implantation process. Accordingly, a semiconductor oxide layer 125 is formed at a desired depth in the single crystalline semiconductor plug 121. For example, when the single crystalline semiconductor plug 121 is a single crystalline silicon layer, the semiconductor oxide layer 125 may be a silicon oxide layer. As a result, the semiconductor oxide layer 125 is formed at a desired depth in the single crystalline semiconductor plug 121 while the single crystalline semiconductor plug 121 is divided into a lower plug 121B and an upper single crystalline semiconductor plug 121U by the semiconductor oxide layer 125. That is, the upper single crystalline semiconductor plug 121U is electrically insulated from the lower plug 121B by the semiconductor oxide layer 125. Consequently, the upper single crystalline semiconductor plug 121U is formed to have the same crystalline state as that of the single crystalline semiconductor layer 110 and is electrically insulated from the single crystalline semiconductor layer 110.

A surface of the upper single crystalline semiconductor plug 121U may be cleaned. The cleaning process may be performed in order to remove a contaminated material layer formed on a surface of the upper single crystalline semiconductor plug 121U. In this case, the cleaning process may be performed using a wet chemical solution or a dry etch gas which etches the upper single crystalline semiconductor plug 121U.

Figure 5:
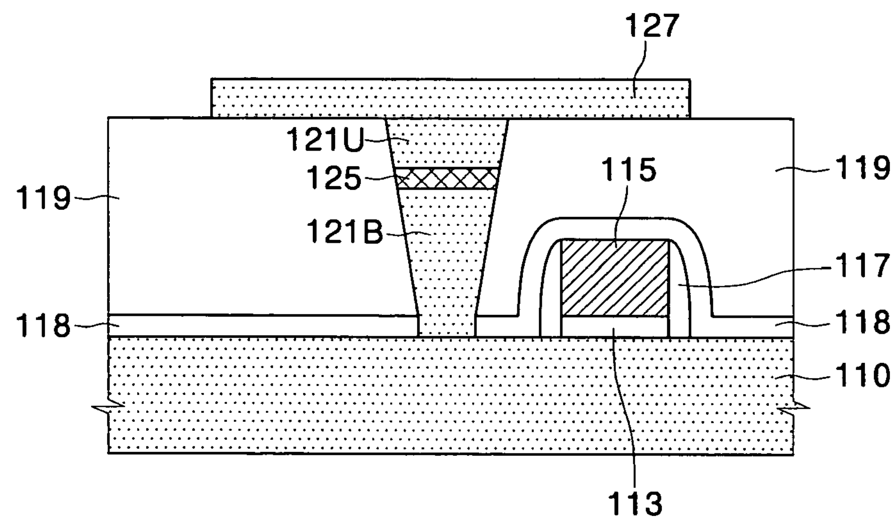

Referring to FIG. 5, a non-single crystalline semiconductor layer such as an amorphous semiconductor layer or a polycrystalline semiconductor layer is formed on the interlayer insulating layer 119 having the upper single crystalline semiconductor plug 121U and the semiconductor oxide layer 125. The non-single crystalline semiconductor layer may be formed using a thin film deposition technique having excellent step coverage. For example, the non-single crystalline semiconductor layer may be formed using a CVD method or an atomic layer deposition method. When the upper single crystalline semiconductor plug 121U is a single crystalline silicon layer, the non-single crystalline semiconductor layer may be formed of an amorphous silicon layer or a polycrystalline silicon layer.

The non-single crystalline semiconductor layer is crystallized using a typical solid phase epitaxial technique. The upper single crystalline semiconductor plug 121U acts as a seed layer during the solid phase epitaxial process. As a result, the non-single crystalline semiconductor layer is crystallized to be transformed to a single crystalline semiconductor thin film.

A typical patterning process is performed on the single crystalline semiconductor thin film to form a single crystalline semiconductor pattern 127.

Alternatively, the solid phase epitaxial process may be performed after the patterning process.

Figure 6:
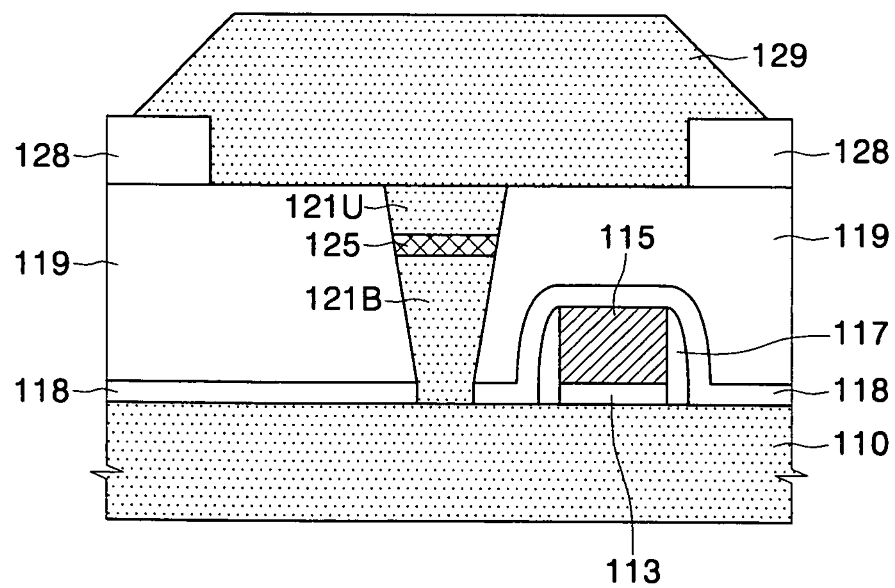
FIGS. 6 and 7 are cross-sectional views illustrating methods of forming a single crystal semiconductor thin film in accordance with other embodiments of the present invention.
Figure 7:
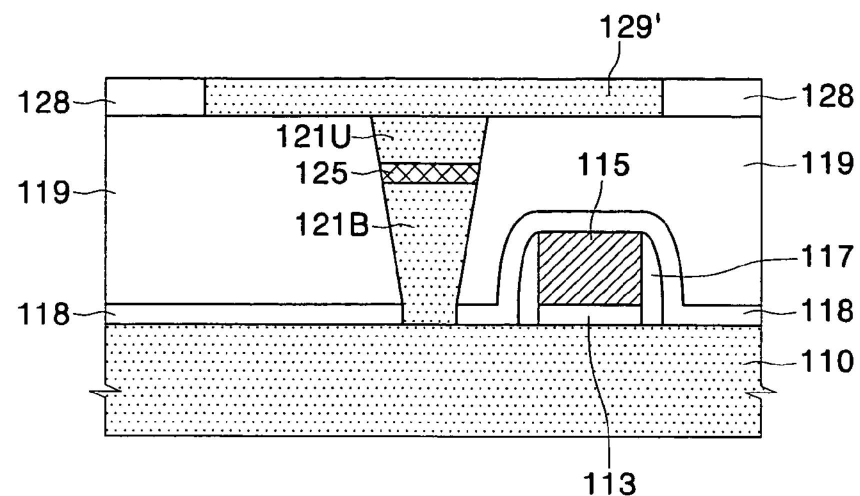

FIGS. 6 and 7 are cross-sectional views illustrating methods of forming a single crystal semiconductor thin film in accordance with other embodiments of the present invention.

Referring to FIG. 6, the methods of forming the single crystalline semiconductor thin film according to the other embodiments of the present invention include forming an interlayer insulating layer 119, a lower plug 121B, a semiconductor oxide layer 125, and an upper single crystalline semiconductor plug 121U as in the method described with reference to FIGS. 2 to 4.

A polishing stopper pattern 128 is formed on the interlayer insulating layer 119 having the semiconductor oxide layer 125 and the upper single crystalline semiconductor plug 121U. The polishing stopper pattern 128 exposes a predetermined region of the interlayer insulating layer 119 while exposing the upper single crystalline semiconductor plug 121U. The polishing stopper pattern 128 may be formed of an insulating layer such as a HDP oxide layer.

A SEG technique employing the upper single crystalline semiconductor plug 121U as a seed layer is performed to form a single crystalline semiconductor epitaxy pattern 129. As a result, the single crystalline semiconductor epitaxy pattern 129 is grown upward and laterally to cover the interlayer insulating layer 119 and the polishing stopper pattern 128. For example, when the upper single crystalline semiconductor plug 121U is a single crystalline silicon layer, the single crystalline semiconductor epitaxy pattern 129 may be grown using a silicon source gas. That is, the single crystalline semiconductor epitaxy pattern 129 may be a single crystalline silicon pattern.

Referring to FIG. 7, the single crystalline semiconductor epitaxy pattern 129 is planarized to form a single crystalline semiconductor pattern 129' having a uniform thickness on the interlayer insulating layer 119. The planarizing process may be performed using a CMP process employing the polishing stopper pattern 128 as a stop layer.

According to the embodiments of the present invention as described above, the single crystalline semiconductor patterns 128 and 129' are electrically insulated from the single crystalline semiconductor layer 110. In addition, the single crystalline semiconductor patterns 128 and 129' may be formed to have an excellent single crystalline structure.

Figure 8:
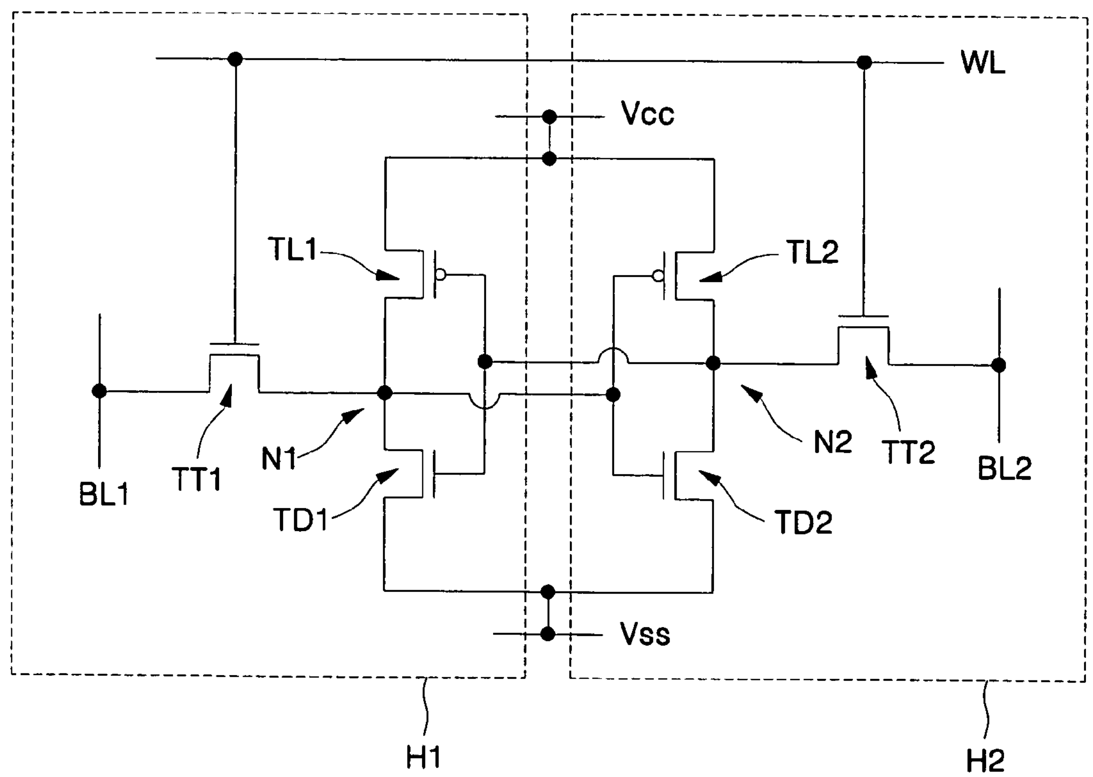
FIG. 8 is a typical equivalent circuit view of a complementary metal oxide semiconductor static random access memory (CMOS SRAM) cell.

FIG. 8 is a typical equivalent circuit view of a complementary metal oxide semiconductor static random access memory (CMOS SRAM) cell.

Referring to FIG. 8, the CMOS SRAM cell includes a pair of driver transistors, TD1, TD2, a pair of transfer transistors, TT1, TT2, and a pair of load transistors, TL1, TL2. The pair of driver transistors TD1 and TD2 and the pair of transfer transistors TT1 and TT2 are all NMOS transistors while the load transistors TL1 and TL2 are all PMOS transistors.

The first transfer transistor TT1 and the first driver transistor TD1 are serially connected to each other. A source region of the first driver transistor TD1 is electrically connected to a ground line Vss, and a drain region of the first transfer transistor TT1 is electrically connected to a first bit line BL1. Similarly, the second driver transistor TD2 and the second transfer transistor TT2 are serially connected to each other. A source region of the second driver transistor TD2 is electrically connected to the ground line Vss, and a drain region of the second transfer transistor TT2 is electrically connected to a second bit line BL2.

Source and drain regions of the first load transistor TL1 are electrically connected to a power line Vcc and the drain region of the first driver transistor TD1, respectively. Similarly, source and drain regions of the second load transistor TL2 are electrically connected to the power line Vcc and the drain region of the second driver transistor TD2, respectively. The drain region of the first load transistor TL1, the drain region of the first driver transistor TD1, and the source region of the first transfer transistor TT1 correspond to a first node N1. In addition, the drain region of the second load transistor TL2, the drain region of the second driver transistor TD2, and the source region of the second transfer transistor TT2 correspond to a second node N2. A gate electrode of the first driver transistor TD1 and a gate electrode of the first load transistor TL1 are electrically coupled with the second node N2, and a gate electrode of the second driver transistor TD2 and a gate electrode of the second load transistor TL2 are electrically connected to the first node N1. In addition, gate electrodes of the first and second transfer transistors TT1, TT2 are electrically connected to a word line WL.

The above-described CMOS SRAM cell shows a large noise margin as well as a small stand-by current compared to a high resistor SRAM cell. Accordingly, the CMOS SRAM cell is widely employed for a high performance SRAM that requires a low power voltage. In particular, when the TFT SRAM cells include high performance P-channel TFTs with enhanced electrical characteristics corresponding to P-channel bulk transistors used as load transistors of the bulk CMOS SRAM cell, the TFT SRAM cells have advantages in terms of integration density, latch-up immunity, etc. over the bulk CMOS SRAM cell.

In order to implement the high performance P-channel TFT, the TFT should be formed in a body pattern formed of a single crystalline semiconductor layer. In addition, ohmic contacts should be formed in the first and second nodes N1 and N2 shown in FIG. 8.

Referring to FIG. 8, the first driver transistor TD1, the first transfer transistor TT1, and the first load transistor TL1 constitute a first half cell H1, and the second driver transistor TD2, the second transfer transistor TT2, and the second load transistor TL2 constitute a second half cell H2.

Figure 9:
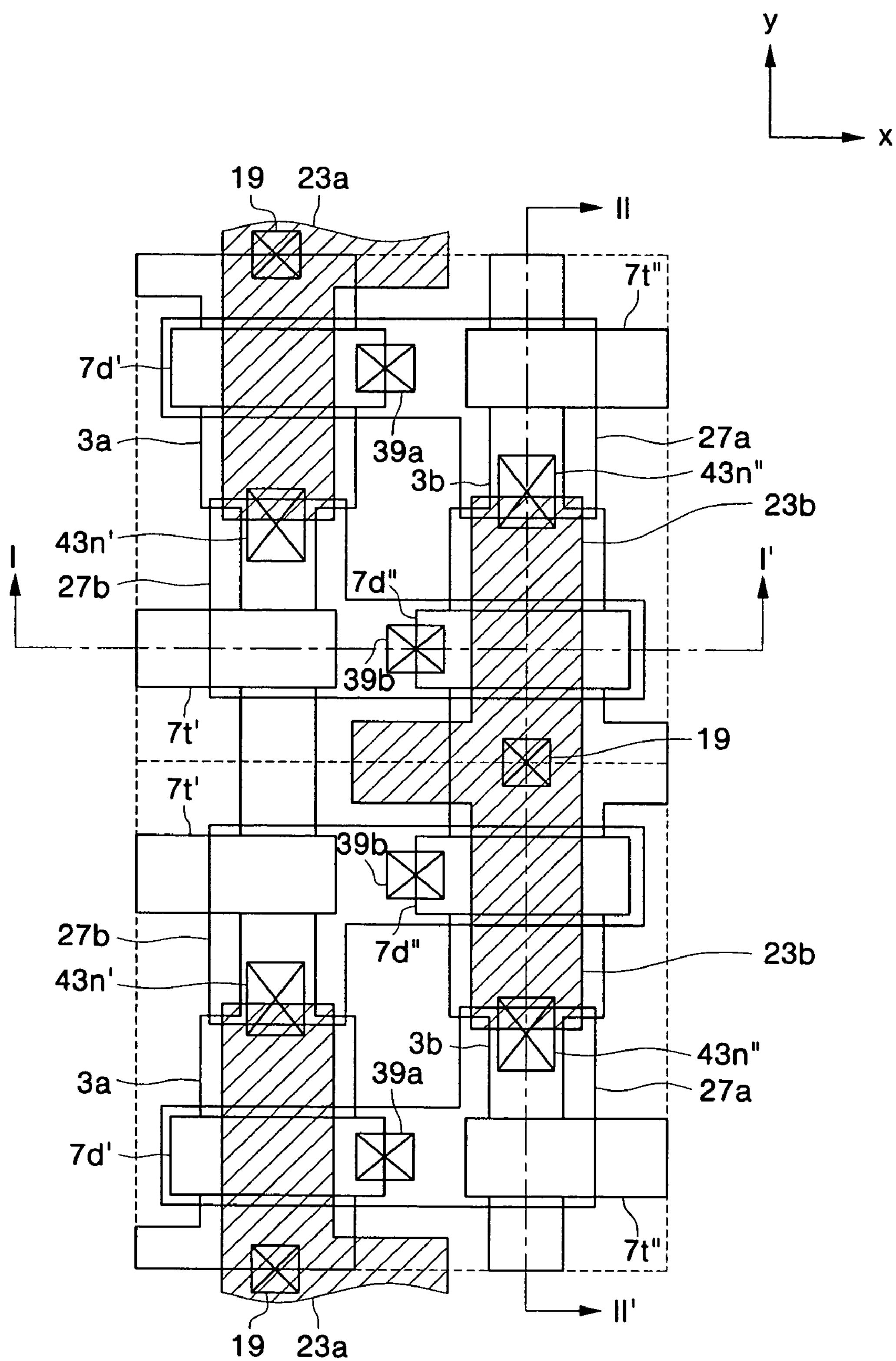
FIG. 9 is a plan view of CMOS SRAM cells employing thin film transistors fabricated in accordance with embodiments of the present invention.
Figure 10:
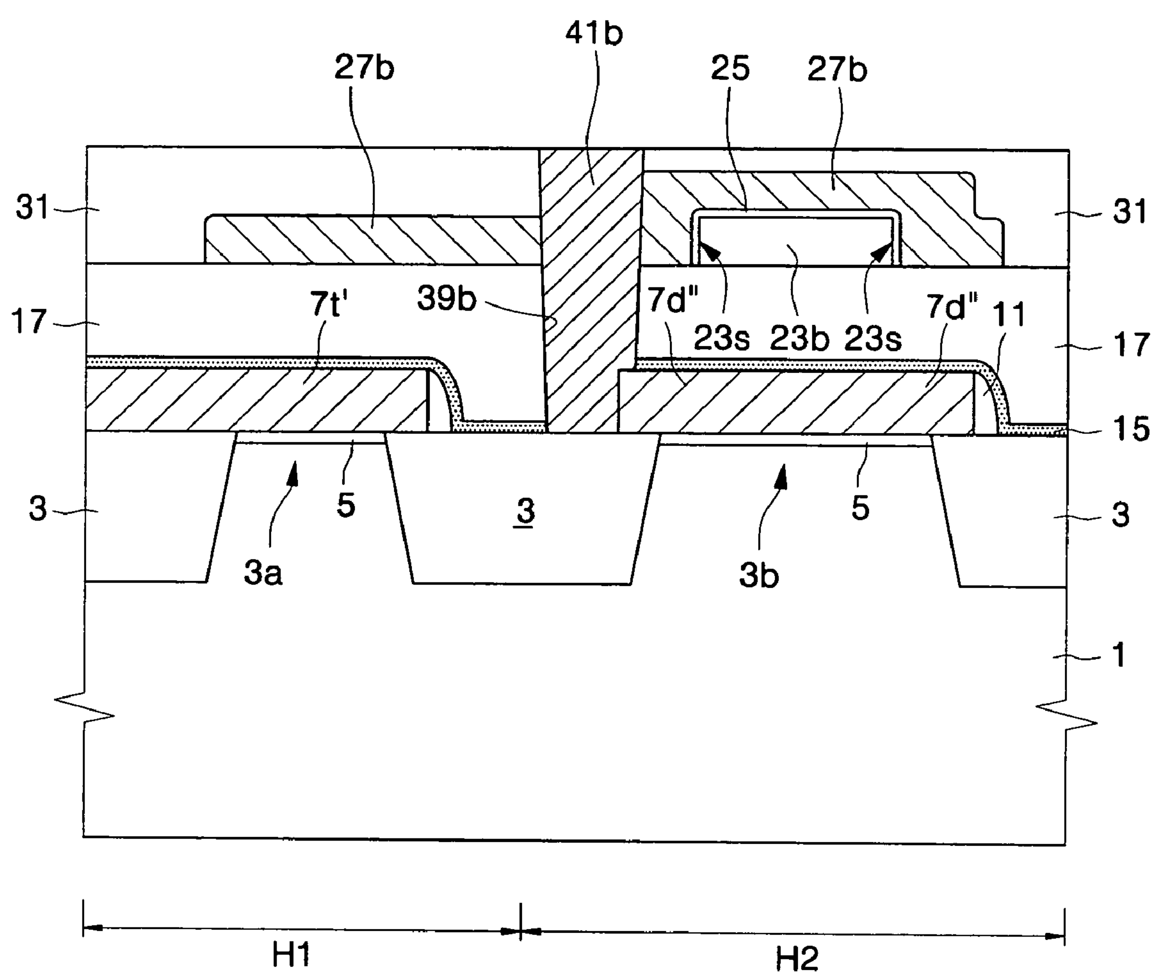
FIG. 10 is a cross-sectional view taken along the line I-I' of FIG. 9, illustrating CMOS SRAM cells employing thin film transistors in accordance with embodiments of the present invention.
Figure 11:
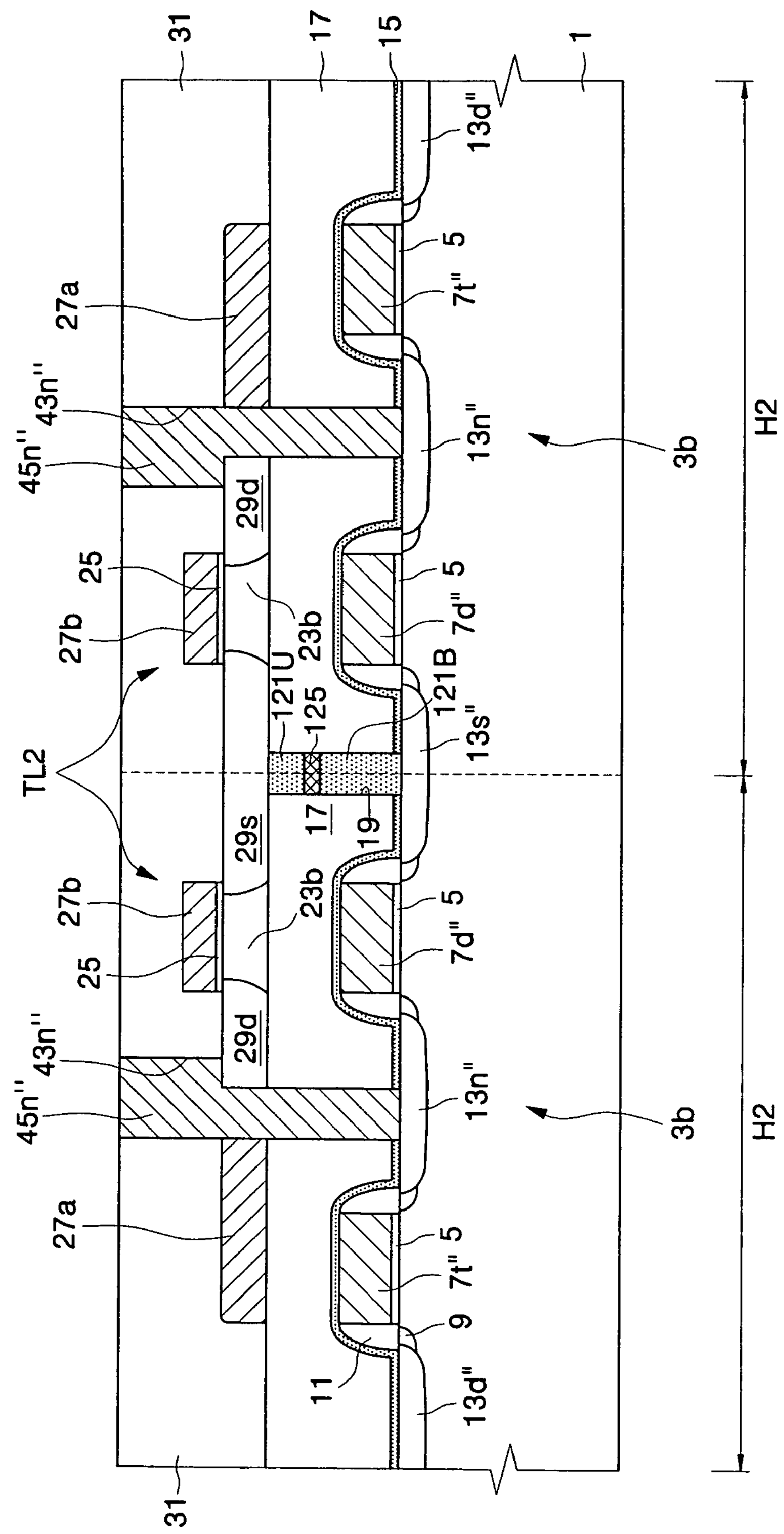
FIG. 11 is a cross-sectional view taken along the line II-II' of FIG. 9, illustrating CMOS SRAM cells employing thin film transistors in accordance with embodiments of the present invention.

FIG. 9 is a plan view of CMOS SRAM cells employing thin film transistors fabricated in accordance with embodiments of the present invention. The pair of TFT SRAM cells shown in FIG. 9 is symmetrical with respect to the x-axis. The pair of TFT SRAM cells is repeatedly arranged to be symmetrical with respect to x and y axes so that a cell array region is formed. In addition, each of the pair of TFT SRAM cells shown in FIG. 9 has a plan view of a CMOS SRAM cell corresponding to the equivalent circuit of FIG. 8. FIG. 10 is a cross-sectional view taken along the line I-I' of FIG. 9 illustrating CMOS SRAM cells employing thin film transistors in accordance with embodiments of the present invention, and FIG. 11 is a cross-sectional view taken along the line II-II' of FIG. 9 illustrating CMOS SRAM cells employing thin film transistors in accordance with embodiments of the present invention. That is, FIG. 10 shows a cross-sectional view crossing the first half cell region H1 and the second half cell region H2 adjacent to each other, and FIG. 11 shows a cross-sectional view crossing a pair of the second half cell regions H2 adjacent to each other.

Referring to FIGS. 8, 9, 10, and 11, the pair of TFT SRAM cells according to embodiments of the present invention has an isolation layer 3 in a predetermined region of the single crystalline semiconductor substrate such as a single crystalline silicon substrate to define first and second active regions 3*a* and 3*b* in the first and second half cell regions H1 and H2, respectively. Each of the first and second active regions 3*a* and 3*b* may have a transfer transistor active region and a driver transistor active region. A first driver gate electrode 7*d*' and a first transfer gate electrode 7*t*' crossing over the first active region 3*a* together with a second driver gate electrode 7*d*" and a second transfer gate electrode 7*t*" crossing over the second active region 3*b* are formed. A gate insulating layer 5 is interposed between the active regions 3*a* and 3*b* and the gate electrodes 7*d*', 7*d*", 7*t*', and 7*t*".

The first transfer gate electrode 7*t*' and the first driver gate electrode 7*d*' are formed to cross over the transfer transistor active region and the driver transistor active region in the first active region 3*a*, respectively, and the second transfer gate electrode 7*t*" and the second driver gate electrode 7*d*" are formed to cross over the transfer transistor active region and the driver transistor active region in the second active region 3*b*. Gate spacers 11 may be formed on sidewalls of the transfer gate electrodes 7*t*' and 7*t*" and the driver gate electrodes 7*d*' and 7*d*".

A first node impurity region (not shown) is formed within the first active region 3*a* between the first driver gate electrode 7*d*' and the first transfer gate electrode 7*t*', a first bit line impurity region (not shown) is formed within the first active region 3*a* which is adjacent to the first transfer gate electrode 7*t*' and is positioned on the opposite side of the first node impurity region, and a first ground impurity region (not shown) is formed within the first active region 3*a* which is adjacent to the first driver gate electrode 7*d*' and is positioned on the opposite side of the first node impurity region. Similarly, a second node impurity region 13*n*" is formed within the second active region 3*b* between the second driver gate electrode 7*d*" and the second transfer gate electrode 7*t*", a second bit line impurity region 13*d*" is formed within the second active region 3*b* which is adjacent to the second transfer gate electrode 7*t*" and is positioned on the opposite side of the second node impurity region 13"*n*, and a second ground impurity region is formed within the second active region 3*b* which is adjacent to the second driver gate electrode 7*d*" and is positioned on the opposite side of the second node impurity region 13*n*". In this case, lightly doped drain (LDD) regions 9 may remain below the gate spacers 11. The impurity regions 13*s*", 13*n*", and 13*d*" have a concentration higher than that of the LDD regions 9. That is, LDD type source and drain regions are formed within the active regions 3*a* and 3*b*. Consequently, the first transfer transistor TT1 and the first driver transistor TD1 which are serially connected to the first active region 3*a* are formed, and the second transfer transistor TT2 and the second driver transistor TD2 which are serially connected to the second active region 3*b* are formed.

A first interlayer insulating layer 17 is formed on the entire surface of the semiconductor substrate having the impurity regions 13*s*", 13*n*", and 13*d*". The first interlayer insulating layer 17 may be a silicon oxide layer. A conformal etch stop layer 15 may be interposed between the first interlayer insulating layer 17 and the impurity regions 13*s*", 13*n*", and 13*d*". The etch stop layer 15 is preferably an insulating layer having an etch selectivity to the first interlayer insulating layer 17. For example, the etch stop layer 15 may be a silicon nitride layer.

A contact hole 19 penetrates the first interlayer insulating layer 17 and the etch stop layer 15 to expose the ground impurity region 13*s*". A lower plug 121B, a semiconductor oxide layer 125, and an upper single crystalline semiconductor plug 121U are sequentially stacked within the contact hole 19 as described with reference to FIG. 4. The upper single crystalline semiconductor plug 121U has the same crystalline state as that of the single crystalline semiconductor substrate 1. For example, the upper single crystalline semiconductor plug 121U may be a single crystalline silicon layer, and the semiconductor oxide layer 125 may be a silicon oxide layer.

A single crystalline semiconductor body 23*b* is formed on the first interlayer insulating layer 17 to cover the upper single crystalline semiconductor plug 121U. That is, the single crystalline semiconductor body 23*b* is formed within the second half cell region H2, and another single crystalline semiconductor body 23*a* is formed within the first half cell region H1. These single crystalline semiconductor bodies 23*a* and 23*b* have a single crystalline semiconductor pattern grown by an epitaxial growth technique using the upper single crystalline semiconductor plug 121U as a seed layer or a single crystalline semiconductor pattern crystallized by a solid phase epitaxial technique using the upper single crystalline semiconductor plug 121U as a seed layer as described with reference to FIGS. 5 and 7. In this case, the single crystalline semiconductor bodies 23*a* and 23*b* are electrically insulated from the ground impurity region 13*s*" by the semiconductor oxide layer 125.

Gate electrodes crossing over the single crystalline semiconductor body 23*b*, i.e., load gate electrodes 27*b*, are formed. Other load gate electrodes 27*a* are formed in the first half cell regions H1 adjacent to the second half cell regions H2. A gate insulating layer 25 is interposed between the single crystalline semiconductor bodies 23*a* and 23*b* and the load gate electrodes 27*a* and 27*b*. A source region 29*s* and a drain region 29*d* are formed within the single crystalline semiconductor bodies 23*b*. The source region 29*s* is formed on the upper single crystalline semiconductor plug 121U, and the drain regions 29*d* are formed on the opposite side of the load gate electrodes 27*a* and 27*b*. The load gate electrodes 27*a* within the first half cell regions H1 may extend to be adjacent to the drain regions 29*d* within the second half cell regions H2. Similarly, the load gate electrodes 27*b* within the second half cell regions H2 may extend to be adjacent to the drain regions within the first half cell regions H1. Consequently, a pair of load thin film transistors TL2 may be formed in the second half cell regions H2, respectively. In addition, another load TFT TL1 may be formed within the first half cell region H1.

Each of the load TFTs TL2 includes the load gate electrode 27*b*, and the drain region 29*d* and the source region 29*s* positioned at both sides of the load gate electrode 27*b*.

In the present embodiments, the load gate electrodes 27*b* may be formed to cover sidewalls 23*s* of the single crystalline semiconductor body 23*b* as shown in FIG. 10. A gate insulating layer 25 is interposed between the single crystalline semiconductor body 23*b* and the load gate electrodes 27*b*. Accordingly, when a gate voltage higher than a threshold voltage is applied to the load gate electrodes 27*b*, a channel region may be formed not only on a top surface of the single crystalline semiconductor body 23*b* but also on the sidewalls 23*s*. Similarly, the load gate electrodes 27*a* formed within the first half cell regions H1 may cover sidewalls of the single crystalline semiconductor body 23*a*. Consequently, the load TFTs TL1 and TL2 according to the present embodiments may have the same structure as that of a fin-type field effect transistor (FET).

A second interlayer insulating layer 31 is formed on the substrate having the load TFTs TL1 and TL2.

First gate contact holes 39*a* are formed to penetrate the second interlayer insulating layer 31, the load gate electrodes 27*a* and 27*b*, the first interlayer insulating layer 17, and the etch stop layer 15 and expose the first driver gate electrodes 7*d*" while second contact holes 39*b* exposing the second load gate electrodes 7*d*" are formed. Metal gate plugs 41*b* are formed within the first and second gate contact holes 39*a* and 39*b*. The metal gate plugs 41*b* may be a metal layer, for example, a tungsten layer having an ohmic contact to all of the load gate electrodes 27*a* and 27*b* and the driver gate electrodes 7*d*' and 7*d"*.

First drain contact holes 43*n*' are formed to penetrate the second interlayer insulating layer 31, the load gate electrodes 27*a* and 27*b*, the first interlayer insulating layer 17, and the etch stop layer 15 and expose the load gate electrodes 27*b*, the drain regions 29*d* and the first node impurity regions within the first half cell regions H1 while second drain contact holes 43*n*" exposing the load gate electrodes 27*a*, the drain regions 29*d* and the second node impurity regions 13.*n*" within the second half cell regions H2 are formed. Node metal plugs 45*n*" are formed within the drain contact holes 43*n*' and 43*n*". The node metal plugs 45*n*" may be a metal layer, for example, a tungsten layer having an ohmic contact to all of the load gate electrodes 27*a* and 27*b*, the drain regions 29*d*, and the node impurity regions 13*n"*.

According to the present invention as mentioned above, a single crystalline semiconductor plug penetrating an interlayer insulating layer is formed, and an ion implantation process containing oxygen (O) and an annealing process are performed on the single crystalline semiconductor plug. As a result, a semiconductor oxide layer is formed at a desired depth in the single crystalline semiconductor plug while the single crystalline semiconductor plug is divided into a lower plug and an upper single crystalline semiconductor plug by the semiconductor oxide layer. The upper single crystalline semiconductor plug is used as a seed layer to form a single crystalline semiconductor pattern on the interlayer insulating layer. The single crystalline semiconductor pattern may be formed to have an excellent single crystalline structure and may be electrically insulated from the lower plug. Accordingly, when a TFT is formed in the single crystalline semiconductor pattern, integration density, reliability, and electrical characteristics of a semiconductor integrated circuit may be significantly improved.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a single crystalline semiconductor thin film, comprising:

forming an interlayer insulating layer on a single crystalline semiconductor layer;

forming a single crystalline semiconductor plug penetrating the interlayer insulating layer;

forming a semiconductor oxide layer within the single crystalline semiconductor plug using ion implantation and annealing techniques while dividing the single crystalline semiconductor plug into a lower plug and an upper single crystalline semiconductor plug, the semiconductor oxide layer being formed between the lower plug and the upper single crystalline semiconductor plug; and forming a single crystalline semiconductor pattern being in contact with the upper single crystalline semiconductor plug and covering the interlayer insulating layer.

2. The method as recited in claim 1, further comprising forming a gate dielectric layer and a gate electrode which are sequentially stacked on the single crystalline semiconductor layer before forming the interlayer insulating layer.

3. The method as recited in claim 1, wherein the single crystalline semiconductor plug is formed by a selective epitaxial growth technique using the single crystalline semiconductor layer as a seed layer.

4. The method as recited in claim 1, wherein the ion implantation is performed by an ion implantation process containing oxygen (O).

5. The method as recited in claim 1, wherein forming the single crystalline semiconductor pattern includes:

forming a non-single crystalline semiconductor layer on the interlayer insulating layer having the upper single crystalline semiconductor plug; and crystallizing the non-single crystalline semiconductor layer employing a solid phase epitaxial technique using the upper single crystalline semiconductor plug as a seed layer.

6. The method as recited in claim 5, wherein the non-single crystalline semiconductor layer is formed of one of an amorphous semiconductor layer and a polycrystalline semiconductor layer.

7. The method as recited in claim 1, wherein the single crystalline semiconductor pattern is formed by a selective epitaxial growth technique using the upper single crystalline semiconductor plug as a seed layer.

* * * * *